United States Patent
Leenaars et al.

[11] Patent Number: 6,139,645
[45] Date of Patent: Oct. 31, 2000

[54] METHOD AND ARRANGEMENT FOR DRYING SUBSTRATES AFTER TREATMENT IN A LIQUID

[75] Inventors: Adriaan F. M. Leenaars; Jacques J. Van Oekel, both of Eindhoven, Netherlands

[73] Assignee: U.S. Philips Corporation, New York, N.Y.

[21] Appl. No.: 09/126,621

[22] Filed: Jul. 30, 1998

Related U.S. Application Data

[63] Continuation of application No. 07/914,654, Jul. 15, 1992, which is a continuation of application No. 07/701,295, May 13, 1991, abandoned, which is a continuation of application No. 07/467,718, Jan. 19, 1990, abandoned.

[30] Foreign Application Priority Data

Feb. 27, 1989 [NL] Netherlands ............................ 8900480

[51] Int. Cl.⁷ ...................................................... B08B 3/04
[52] U.S. Cl. ................................ 134/30; 134/26; 134/32; 134/902; 34/443; 34/444; 34/498
[58] Field of Search ........................... 134/1, 1.2, 2, 25.1, 134/25.4, 26, 30, 32, 34, 902, 37; 34/493, 444, 445, 497, 498, 516, 517, 482

[56] References Cited

U.S. PATENT DOCUMENTS

| | | | |
|---|---|---|---|
| 4,643,774 | 2/1987 | Kishida et al. ............................. | 134/1 |
| 4,722,752 | 2/1988 | Steck ...................................... | 134/25.4 |
| 4,781,764 | 11/1988 | Leenaars .................................. | 134/34 |
| 4,828,751 | 5/1989 | Kremer .................................. | 134/40 X |
| 4,902,350 | 2/1990 | Steck ............................................ | 134/1 |
| 4,911,761 | 3/1990 | McConnell et al. ...................... | 134/11 |
| 5,105,556 | 4/1992 | Kurokawa et al. ......................... | 34/12 |

OTHER PUBLICATIONS

Koppendink et al, Particle reduction on silicon wafers as a result of isopropyl alcohol displacement drying after wet processing, Particles on Surface 2, pp. 235–243, Plenum Press, 1988.
Leenaars et al, Marangoni Drying: A new Extremely Clean Drying Process, Langmuir, 1990, 6, 1701–1703.
Marra et al, Physical Principles of Marangoni Drying, Langmuir, 1991, 7, 2748–2756.
Handbook of Semiconductor Wafer Technoilogy, Noyes Publications, pp. 24, 25, 414, 598, 1993.

*Primary Examiner*—Jill Warden
*Assistant Examiner*—Alexander Markoff
*Attorney, Agent, or Firm*—D. Brice Faller

[57] ABSTRACT

A method and an arrangement is provided for treating substrates, such as, for example, silicon wafers (1), in which the latter are immersed for some time in a bath (2) containing a liquid (1) and are then taken therefrom so slowly that practically the whole quantity of liquid remains in the bath (2). According to the invention, the substrates (1) are brought from the liquid (3) directly into contact with a vapor not condensing thereon via leads (17) with outlet nozzles (18). The vapor is of a substance miscible with the liquid (3), which, when mixed therewith, yields a mixture having a surface tension lower than that of the liquid. It has been found that no drying marks with organic or metallic residues or other contaminations then remain on the substrates (1).

8 Claims, 3 Drawing Sheets

METHOD AND ARRANGEMENT FOR DRYING SUBSTRATES AFTER TREATMENT IN A LIQUID

CROSS REFERENCE TO RELATED APPLICATIONS

This is a continuation of application Ser. No. 07/914,654, filed Jul. 15, 1992, which is a continuation of application Ser. No. 07/701,295, filed May 13, 1991, now abandoned which was a continuation of application Ser. No. 07/467,718, filed Jan. 19, 1990 now abandoned.

The invention relates to a method of treating substrates, in which the latter are immersed for some time in a bath containing a liquid and are then taken therefrom so slowly that practically the whole quantity of liquid remains in the bath. The invention also relates to an arrangement for carrying out such a method.

FIELD OF THE INVENTION

A method of this kind may be used, for example, in the manufacture of electric circuits on all kinds of substrates, such as, for example, integrated circuits on semiconductor wafers (for example of silicon), drives for liquid crystal displays on transparent plates of glass or quartz, or circuits on plates of synthetic material (circuit boards). The method may also be used in the manufacture of shadow masks for television picture tubes or in the manufacture of CD or VLP records. In all these cases, the substrates are immersed many times for some time in a bath containing a liquid, for example in galvanic baths for deposition of metals, in etching baths for etching patterns into metal layers or into semiconductor material, in development baths for developing exposed photolacquer layers and in rinsing baths for cleaning the substrates. After treatment in the liquid baths, the substrates are taken from the liquid and are dried. The substrates can be taken from the liquid when they are lifted or withdrawn from the liquid, but also of course when the liquid is caused to flow out of the bath.

BACKGROUND OF THE INVENTION

U.S. Pat. No. 4,722,752 discloses a method of the kind mentioned in the opening paragraph, in which silicon wafers are immersed for some time for cleaning in a liquid containing hot (90° C.) deionized water. Subsequently, the silicon wafers are lifted from the water slowly (at a speed of about 5 cm/min. This speed is sufficiently low to ensure that the silicon wafers leave the bath in practically dry state. The surface tension then should play a part.

It has been found in practice that in this method of drying contaminations from the liquid can remain on the substrates. It has been found that with the known method described a water film having a thickness of a few microns remains on the silicon wafers. This water film then evaporates rapidly, and this may give rise to so-called "drying marks". During drying, the water film can be contracted so that contaminations in the water, which are often of organic or metallic nature, remain in local concentration on the wafers. Such residues can be very disturbing if, for example, the wafers must still be subjected to an etching treatment. They can locally delay the etching treatment or even prevent this treatment. Further, of course dust particles present in the water film also remain on the wafers.

SUMMARY OF THE INVENTION

The invention has inter alia for its object to provide a method, in which the disadvantages are obviated.

For this purpose, according to the invention, the method mentioned in the opening paragraph is characterized in that the substrates are brought directly from the liquid into contact with a vapour not condensing thereon of a substance, which is miscible with the liquid and yields, when mixed therewith, a mixture having a surface tension lower than that of the liquid. It is then a surprise to find that, after the substrates have been dried in this manner, no drying marks and contaminations are present any longer on these substrates. Further, experiments have shown that, if a liquid film nevertheless remains on the substrates, this film must be thinner than 3 nm.

It is presumed that the much more satisfactory drying with the use of the method according to the invention, in which apparently a much smaller quantity of liquid or no liquid remains on the substrates, is obtained by the Marangoni effect. If a lyophilic substrate is partly immersed in a liquid, the liquid constitutes at the substrate a concave meniscus. A liquid film having a thickness increasing in the direction of the liquid bath is then present on the substrate. If such a liquid film is brought into contact with a vapour not condensing on the substrate of a substance miscible with the liquid, this substance will be mixed with the liquid in the film in such a manner that its concentration therein initially decreases in the direction of the liquid bath. The concentration of the substance then exhibits a gradient in the liquid film. Since, when mixed with the liquid, the substance yields a mixture having a surface tension which is lower than that of the liquid, the gradient in the concentration will result in a gradient in the surface tension in the liquid film. By this gradient an additional force is exerted on the liquid film in the direction of the liquid bath (Marangoni effect). Thus, a more satisfactory drying of the substrates is obtained.

In the method according to the invention, the vapour does not condense on the substrates. If this should happen, the substrates would be covered, after having been taken from the liquid, with a layer of condensed vapour. Of course, such a layer must also be removed, and as a result the drying process will take more time. Further, such a layer can attack the substrate. This is the case, for example, if the layer contains an organic solvent and if the substrate is provided, for example, with a photolacquer pattern. In practice, also more dust particles will remain on the substrates after drying. An experiment with a vapour condensing on the substrates showed that about ten times more dust particles were present on the substrates than with a vapour not condensing thereon. A vapour not condensing on the substrates has a vapour pressure which is not saturated at the temperature of the bath and the substrates, whereas a vapour condensing on the substrates indeed has such a saturated vapour pressure.

As already stated above, substrates can be treated in different liquid baths. In practice, however, these baths mostly contain water. In this case, preferably an organic solvent is used as a substance miscible with the liquid. It has been found that many alcohols, glycols, aldehydes, esters and ketones, and also a solvent, such as tetrahydrofurane, can ensure that the substrates are dried satisfactorily. The method according to the invention can also be utilized successfully if the baths contain other liquids, such as for example, alcohol. The substrates may be brought directly from alcohol into contact with the vapour of the organic solvent 1,1,1-trifluorotrichloroethane in order to obtain a satisfactory drying.

If the bath in which the substrates are immersed for some time contains water, according to the invention, use is preferably made of an organic solvent having a solubility in water which is higher than 1 g/l and having a vapour pressure lying between 25 and 25,000 Pascal. Experiments have shown that with these conditions satisfactory drying results are obtained. If the solubility in water is lower than this amount, evidently too little vapour is taken up by the liquid to cause a surface tension gradient which is sufficiently large to obtain the desired drying. If the vapour pressure is lower than the lower limit, evidently a sufficient quantity of vapour is not taken up by the liquid either. If the vapour pressure is higher than the upper limit, such a large quantity of vapour is taken up by the liquid that also in this case a surface tension gradient is evidently obtained which is too small to obtain the desired drying.

The substrates can be taken from water comparatively rapidly (at a speed up to 1.5 cm/sec) if according to the invention an organic solvent is used from the group comprising ethyl glycol, 1-propanol, 2-propanol and tetrahydrofurane.

If substrates covered with a layer of photolacquer are taken from water (for example after development), 2-propanol is preferably used as organic solvent. The photolacquer is practically not attacked by this vapour.

Preferably, the substrates are brought into contact with the vapour by mixing the vapour with a carrier gas and by passing this mixture over the liquid. Thus, the vapour can be brought both locally and in high concentration into contact with the substrates. The pressure of the vapour can then be chosen so that the condensation thereof on the substrates is readily avoided.

When substrates, for example silicon wafers, are taken from a liquid and are brought into contact, as described above, with a suitable vapour where they are partly carried above the liquid by means of a lifting member present in the liquid, those parts which then project above the liquid will be dry. If the substrates are then gripped at these dry parts and are further lifted out of the liquid, a drop of liquid can stick to those parts of the substrates which are the last to leave the liquid. Such a drop of liquid at the edge of an otherwise dry substrate need not be objectionable, but may give rise to the problems already mentioned above. It is a surprise to find that the formation of such drops is avoided if according to the invention, when taking the substrates from the liquid, those parts thereof which are the last to leave the liquid are supported when leaving the liquid by a knife-shaped member. The drops then flow away on this knife-shaped member. It is particularly practical if the substrates are lifted from the liquid by means of the knife-shaped member.

The invention further relates to an arrangement for carrying out the method mentioned in the opening paragraph, this arrangement being provided with a lifting member for lifting the substrates above the liquid and with means for gripping the dry substrates above the liquid.

Such an arrangement is known from U.S. Pat. No. 4,722, 752, in which the lifting member lifts the substrates partly out of the liquid, whereupon the substrates are gripped at their dry parts and are further lifted from the liquid by a substrate cassette. The lifting member then remains under the liquid so that wet parts of the substrates, when leaving the liquid, are in contact neither with the lifting member nor with the substrate cassette. At such contact areas drops of liquid could be left behind.

In order to obtain a satisfactory drying of the substrates, the latter are brought into contact, as described above, immediately upon leaving the liquid with a vapour not condensing thereon of a substance which, when mixed with a liquid, yields a mixture having a surface tension lower than that of the liquid. For this purpose, the arrangement according to the invention is provided with gas with outlet openings to bring this vapour into the desired contact with the substrates.

On the lower side of the substrates, which in the known arrangement are taken from the liquid, a drop of liquid sticks. In order to avoid this, the arrangement according to the invention is provided with a knife-shaped member, which supports the substrates when lifted from the liquid at those parts of the substrates which are the last to leave the liquid. The drops then flow away via the knife-shaped member.

Preferably, the knife-shaped member is provided on the lifting member so that the substrates are lifted from the liquid by the knife-shaped member. Thus, a practical and simple arrangement is obtained.

BRIEF DESCRIPTION OF THE DRAWINGS

The invention will now be described more fully, by way of example, with reference to a drawing and a few embodiments. In the drawing.

DESCRIPTION OF THE INVENTION

Figure 1:
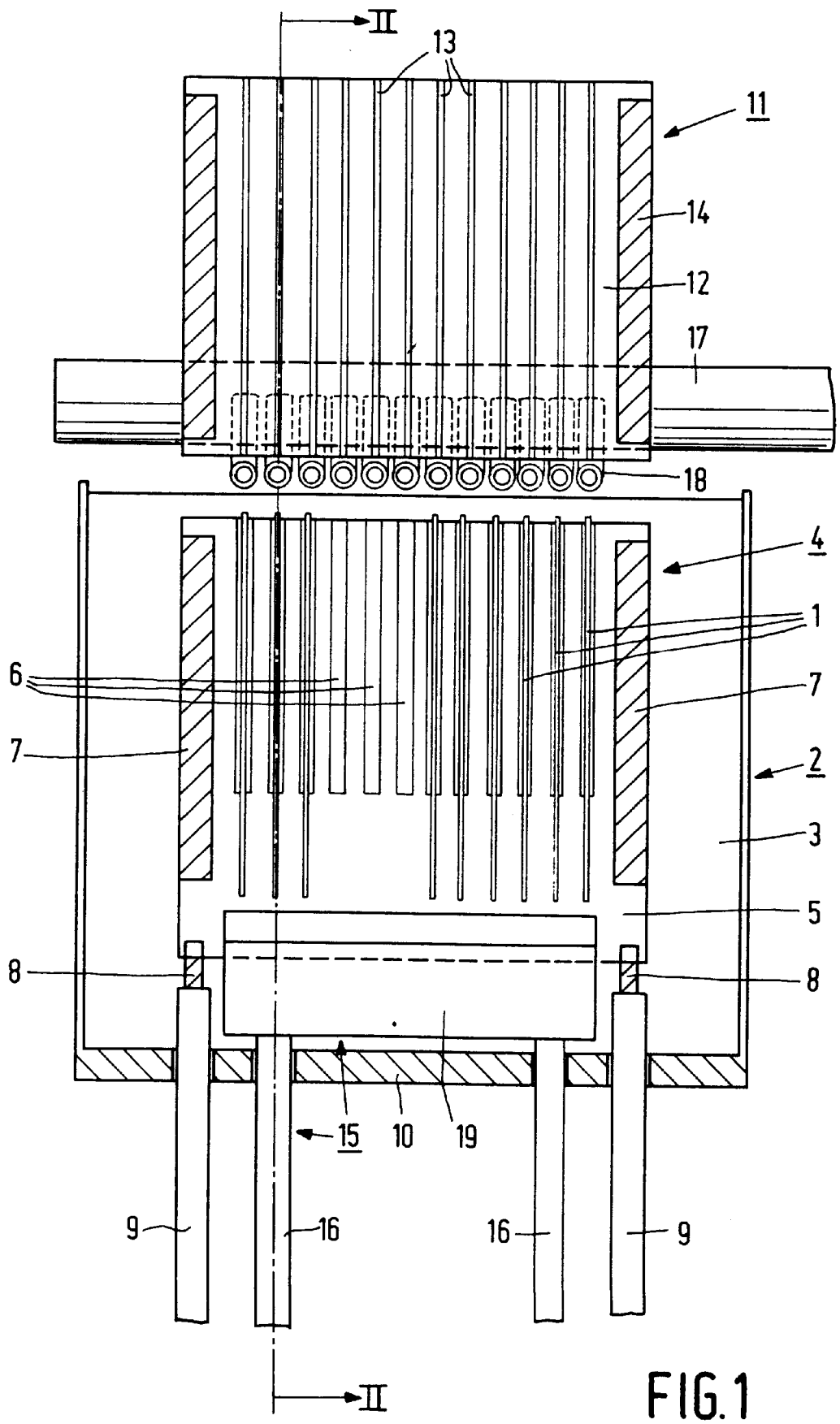
FIG. 1 is a diagrammatic longitudinal sectional view of the arrangement according to the invention.
Figure 2:
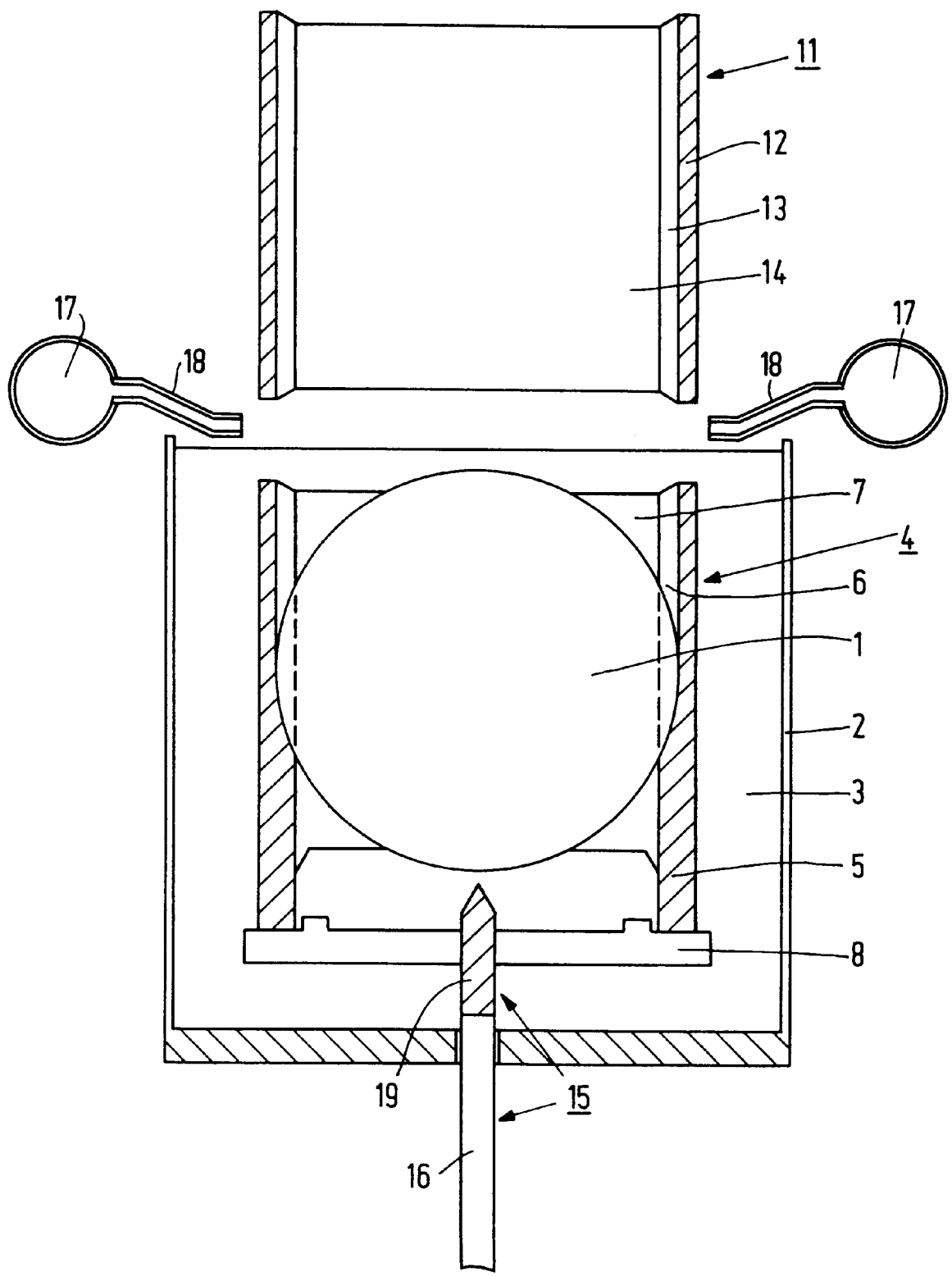
FIG. 2 shows a cross-section of the arrangement shown in FIG. 1 taken on the line II—II.

FIGS. 1 and 2 show diagrammatically an arrangement for carrying out a method for treating substrates 1, in which these substrates are immersed for some time in a bath 2 containing a liquid 3 and are then taken therefrom so slowly that practically the whole quantity of liquid 3 remains in the bath 2. Although this method may be used for treating all kinds of substrates, such as plates of glass, quartz or synthetic material, in this example silicon wafers are treated. If semiconductor devices, such as transistors, diodes or integrated circuits, are manufactured on such wafers, these wafers are immersed many times for some time in a bath containing liquid, such as for example, in an etching, development or cleaning bath. After these treatments, the wafers 1 are taken from the liquid 3 and are dried.

In the arrangement shown in FIGS. 1 and 2, the substrates are immersed in the liquid 3. They are arranged in a teflon cassette 4 having side walls 5 which are provided with grooves 6 for receiving the substrates 1. The side walls 6 are interconnected by transverse walls 7. The cassette 4, which is not shown in detail for the sake of clarity, is filled with substrates and can often comprise in practice a considerably larger number of substrates than is shown in the drawing. The cassette 4 bears in the liquid 3 on two supporting arms 8, which can be moved upwardly by means of shafts 9. The shafts 9 are passed through the bottom 10 of the bath 2 and are driven by driving means not shown so that the cassette 4 can be lifted out of the liquid 3. Above the liquid 3, an auxiliary cassette 11 is arranged having side walls 12 which are provided with grooves 13 for receiving the substrates 1. The side walls 12 are interconnected by transverse walls 14. The auxiliary cassette 11 can move vertically up and down, guided by guides not shown in the drawing for the sake of clarity. In its lowermost position, it is located, as shown in FIGS. 1 and 2, at a small distance from the liquid 3.

Further, the arrangement comprises a lifting member 15, which can be moved upwardly by means of shafts 16 passing through the bottom 10 of the bath 2 and which are driven by driving means not shown. Thus, the substrates 1 can be slipped or moved upwardly from the cassette 4 into the auxiliary cassette 11.

The arrangement also comprises gas leads 17 with outlet nozzles 18 to bring the substrates 1, when they are slipped from the cassette 4 into the auxiliary cassette 11, immediately after leaving the liquid 3 into contact with a vapour of a substance which can be mixed with the liquid 3. The substance of the vapor yields, when mixed with the liquid 3, a mixture having a surface tension lower than that of the liquid 3. The substrates, which are then lifted in a dry state from the liquid, are also then gripped above the liquid by the auxiliary cassette 11.

FIGS. 3 to 6 show diagrammatically a few stages of carrying out the method according to the invention by means of the arrangement described above.

Figure 6:
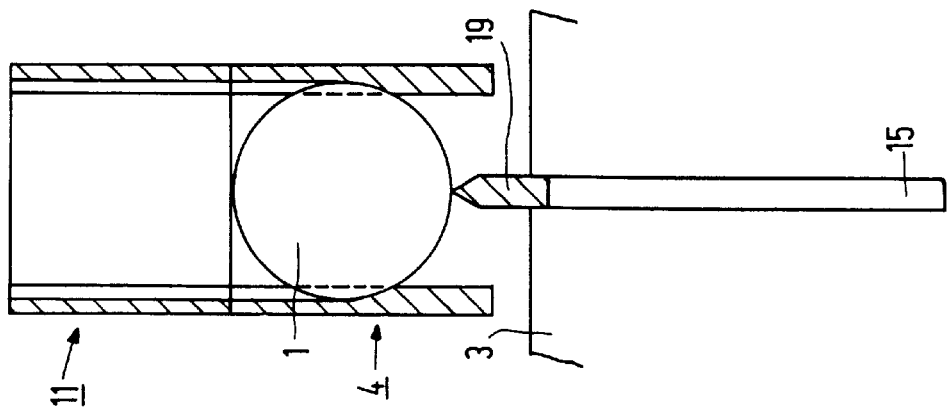
FIGS. 3, 4, 5 and 6 show diagrammatically a few stages of carrying out the method according to the invention by means of the arrangement shown in FIGS. 1 and 2.
Figure 5:
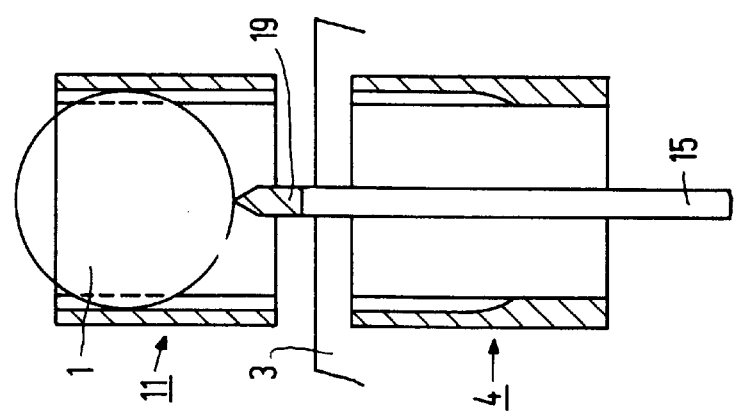
Figure 4:
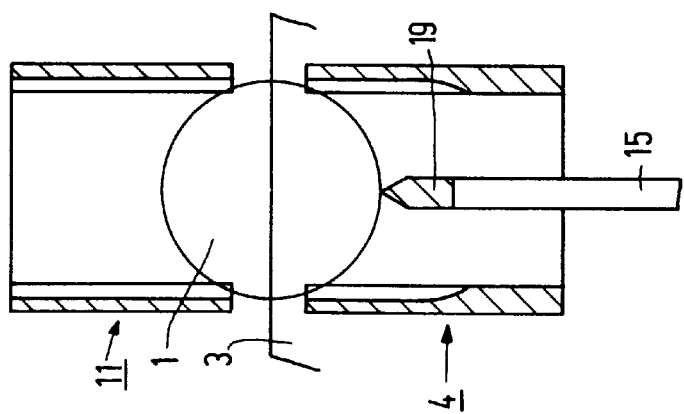
Figure 3:
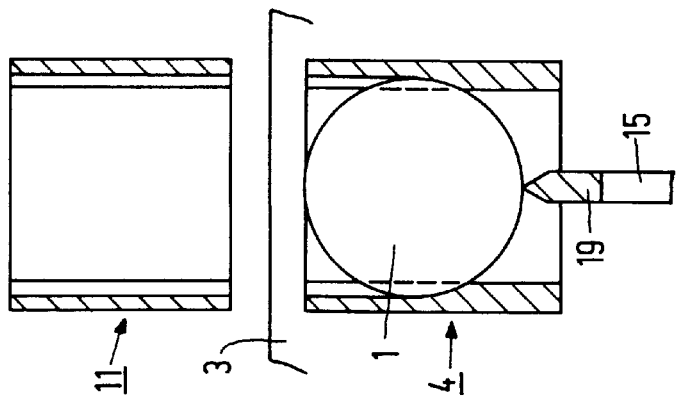

FIG. 3 again shows the stage already shown in the arrangement of FIGS. 1 and 2. The substrates 1 are located in the liquid 3 in the cassette 4. The substrates 1 are taken from the liquid after having been immersed in the liquid for some time when they are slipped by means of the lifting member 15 from the cassette 4 into the auxiliary cassette 11, as is indicated in FIGS. 4 and 5. Subsequently, the cassette 4 is lifted from the liquid, this cassette moving upwardly the auxiliary cassette 11, which is vertically movable, as indicated in FIG. 6. The cassette 4, which leaves the liquid in a dry state because it is made of a hydrophobic material, can then be removed with the dry substrates 1.

The substrates 1 are taken so slowly from the liquid 3 that practically the whole quantity of liquid remains in the bath. According to the invention, the substrates 1 are brought directly from the liquid 3 into contact with a vapour not condensing thereon of a substance miscible with the liquid, which, when mixed therewith, yields a mixture having a surface tension lower than that of the liquid. It has been found that the substrates 1 then substantially do not exhibit drying marks or other contaminations. If the substrates 1 are taken by means of the arrangement described above from a bath containing water without the vapour being supplied, it has been found that a water film having a thickness of a few microns remains on the substrates 1. This film evaporates rapidly, it is true, but drying marks and other contaminations from the water film then remain on the substrates 1. The drying marks generally comprise organic and metallic residues, which may be very disturbing when further processing the substrates.

In practice, the liquid 3 in the bath 2 is often water. Preferably, an organic solvent is then used as the substance miscible with the liquid. It has been found that many alcohols, aldehydes, esters and ketones and, for example, also tetrahydrofurane can cause the substrates to be dried satisfactorily. Preferably, an organic solvent is further used having a solubility in water which is higher than 1 g/l and having a vapour pressure lying between 25 and 25,000 Pascal. As will appear from the embodiments, satisfactory drying results are then obtained. If the solubility is lower than this amount or if the vapour pressure lies outside the given range, the drying is less satisfactory and, as will also appear, drying surfaces can then be observed on the treated substrates.

The substrates can be taken from water comparatively rapidly (at a speed of up to 1.5 cm/sec) if according to the invention an organic solvent from the group comprising ethyl glycol, 1-propanol, 2-propanol and tetrahydrofurane is used.

If substrates covered with a layer of photolacquer are taken from water, for example from a development bath, preferably 2-propanol is used as the organic solvent. The photolacquer is then practically not attacked.

Preferably, the substrates 1 are brought into contact with the vapour when the latter is mixed in a usual manner with a carrier gas and when this mixture is then passed through the leads 17 and the outlet nozzles 18 over the liquid 3. Thus, the vapour can be supplied locally and in high concentration without condensation of the vapour on the substrates 1 taking place.

As will appear from the Figures, when taking the substrates 1 from the liquid 3, those parts which are the last to leave the liquid 3 are supported when leaving the liquid 3 by a knife-shaped member 19. According to the invention, this knife-shaped member 19 forms parts of the lifting member 15 and the substrates are lifted from the liquid by the knife-shaped member 19. The knife-shaped member 19 is made, for example, of quartz glass and has an apical angle of less than 100°. When the substrates are lifted from the liquid 3, the whole quantity of liquid now flows away from the substrates via this knife-shaped member 19. If at the stage of the method shown in FIG. 4 the substrates 1 should be gripped at their dry parts and should be further lifted from the liquid 3, a drop of liquid would stick to the substrates 1. Then this last drop flows away via the knife-shaped member 19. As will further appear from the Figures, when the substrates 1 leave the liquid 3 there is no contact between wet parts of these substrates with the cassette 4 and with the auxiliary cassette 11. If this should be the case, at the areas at which there was such a contact drops of liquid could stick and remain.

Embodiments

In the manner described above, silicon wafers—which were cleaned before in a usual manner in a U.V. ozone cabinet—were immersed in water and were then lifted therefrom at a speed of about 1 mm/sec. The water was intentionally strongly contaminated to a 1 M NaCl solution. The substrates were directly brought into contact, when leaving the liquid, with a vapour which does not condense thereon. The vapor is of different solvents which are miscible with water and yield a mixture having a surface tension which is lower than that of water when about 0.5 l of nitrogen is passed per second through a washing flask containing the organic solvent and when the gas mixture is then passed over the liquid via the leads 17 and the outlet nozzles 18. In the following table, the results of these experiments are indicated. In the column labeled "result", the symbol, "+" indicates that under a microscope with a magnification of 500 times no drying marks can be observed on the substrates, whereas the symbol "−" indicates that such marks can be observed. Further, the vapour pressure and the solubility of the examined organic solvents are indicated in the table. It has been found that these two quantities must lie within the limits already indicated above in order to obtain a satisfactory drying of the substrates. The complete solubility mentioned in the table means that mixtures can be formed having a concentration between 0 and 100% of organic solvent.

TABLE

| Solvent | Vapor pressure in (Pa) | Solubility in water (gr/litre) | Result |
|---|---|---|---|
| Ethyleneglycol | 6 | completely | − |
| Ethylglycol | 500 | " | + |
| 1-Propanol | 1,870 | " | + |
| 2-Propanol | 4,300 | " | + |
| Tetrahydrofurane | 20,000 | " | + |
| 4-hydroxy-4-methyl-2-penthamone | 100 | " | + |
| 1-butanol | 670 | 790 | + |
| 2-butanol | 1,730 | 125 | + |
| Diethylether | 58,700 | 12 | − |
| Tetrachloromethane | 12,000 | 0.8 | − |
| Octane | 1,500 | 0.1 | − |

We claim:

1. A method of treating a substrate using Marangoni Effect comprising the steps of:
   a) immersing the substrate in a bath of a liquid,
   b) maintaining the substrate in the liquid for a given period of time, and
   c) separating the substrate from the liquid and bringing the surface of the liquid and the substrate, during separation of the substrate from the liquid, directly into contact with a stream of carrier gas comprising vapor of an organic compound,
   wherein
   i) the vapor of the organic compound has a vapor pressure which is not saturated at the temperature of the substrate so that during said separation condensation of the vapor on the substrate will not occur,
   ii) the organic compound is chosen from a group of organic compounds which are soluble in the liquid and which upon dissolving in the liquid lower the surface tension thereof, and
   iii) the vapor pressure of the organic compound, the solubility of the organic compound in the liquid, and the speed with which the substrate is separated from the liquid creating a gradient in the surface tension of the liquid at the interface where the substrate intersects the surface of the liquid during said separation of the substrate from the liquid, the surface tension decreasing above the surface of the liquid such that, during said separation, substantially no liquid remains attached to the substrate.

2. A method as claimed in claim 1, characterized in that water is chosen as the liquid and as the organic compound an organic compound is chosen which has a solubility in water which is higher than 1 g/l and which has a vapor pressure which lies between 25 and 25,000 Pascal.

3. A method as claimed in claim 1, characterized in that as the speed with which the substrate is separated from the liquid, a speed is chosen which is smaller than 15 mm/s.

4. A method as claimed in claim 1, characterized in that the organic compound is chosen from the group of organic compounds comprising ethyl glycol, 1-propanol, 2-propanol and tetrahydrofurane.

5. A method as claimed in claim 4, characterized in that as the organic compound 2-propanol is chosen.

6. A method as claimed in claim 1, characterized in that during separation of the substrate from the liquid, that part of the substrate which is the last to be separated from the liquid, is supported by a knife-shaped member.

7. A method as claimed in claim 1, characterized in that the substrate is separated from the liquid by lifting the substrate out of the liquid.

8. A method as claimed in claim 1, characterized in that during the separation of the substrate from the liquid, the substrate is gripped at a part of the substrate which is already separated from the liquid.

* * * * *